United States Patent
Liu

(10) Patent No.: US 10,803,779 B2
(45) Date of Patent: Oct. 13, 2020

(54) GATE DRIVER ON ARRAY (GOA) CIRCUIT UNIT, GOA CIRCUIT, AND DISPLAY PANEL

(71) Applicant: Wuhan China Star Optoelectronics Semiconductor Display Technology Co., Ltd., Wuhan, Hubei (CN)

(72) Inventor: Jie Liu, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 174 days.

(21) Appl. No.: 16/023,872

(22) Filed: Jun. 29, 2018

(65) Prior Publication Data

US 2019/0206291 A1 Jul. 4, 2019

Related U.S. Application Data

(63) Continuation of application No. PCT/CN2018/076548, filed on Feb. 12, 2018.

(30) Foreign Application Priority Data

Dec. 29, 2017 (CN) .......................... 2017 1 1497552

(51) Int. Cl.
*G11C 19/00* (2006.01)
*G09G 3/20* (2006.01)
(Continued)

(52) U.S. Cl.
CPC .............. *G09G 3/20* (2013.01); *G09G 3/3266* (2013.01); *G11C 19/28* (2013.01); *H01L 27/124* (2013.01);
(Continued)

(58) Field of Classification Search
None
See application file for complete search history.

(56) References Cited

U.S. PATENT DOCUMENTS 10,056,041 B1* 8/2018 Ma ........................ G09G 3/3225
2016/0217735 A1* 7/2016 Park ..................... G09G 3/3233
(Continued)

FOREIGN PATENT DOCUMENTS

CN 202720870 U 2/2013
CN 103258514 A 8/2013
(Continued)

OTHER PUBLICATIONS

Office Action dated Nov. 5, 2018 from corresponding application No. CN 201711497552.8.

*Primary Examiner* — Tuan T Lam
(74) *Attorney, Agent, or Firm* — Leong C. Lei

(57) ABSTRACT

A gate driver on array (GOA) circuit unit, including: a scan portion and an emission portion. The scan portion includes: a first thin film transistor (TFT), a second TFT, a third TFT, a fourth TFT, a fifth TFT, a sixth TFT, a first capacitor, a turn-on signal end, a first clock signal end, a second clock signal end, a power supply end, and a first node. The emission includes: a seventh TFT, an eighth TFT, a ninth TFT, a tenth TFT, an eleventh TFT, a twelfth TFT, a thirteenth TFT, a fourteenth TFT, a fifteenth TFT, a sixteenth TFT, a second capacitor, a third capacitor, a fourth capacitor, a third clock signal end, a first controlling clock signal end, a second node, a third node, a fourth node, and a fifth node.

15 Claims, 8 Drawing Sheets

(51) Int. Cl.
  *H01L 27/12* (2006.01)
  *G09G 3/3266* (2016.01)
  *G11C 19/28* (2006.01)

(52) U.S. Cl.
  CPC ............ *G09G 2300/0809* (2013.01); *G09G 2300/0814* (2013.01); *G09G 2310/0264* (2013.01); *G09G 2310/0286* (2013.01); *G09G 2310/08* (2013.01)

(56) References Cited

U.S. PATENT DOCUMENTS

| | | | |
|---|---|---|---|
| 2016/0253938 A1 | 9/2016 | Yu | |
| 2016/0379558 A1* | 12/2016 | Jeon | G09G 3/3225 345/213 |
| 2017/0256203 A1* | 9/2017 | Han | G09G 3/3258 |
| 2017/0323593 A1* | 11/2017 | Kim | G09G 3/2092 |
| 2018/0075923 A1* | 3/2018 | Ma | G11C 19/28 |
| 2018/0096732 A1* | 4/2018 | Cheng | G11C 19/28 |
| 2018/0174553 A1* | 6/2018 | Bong | G09G 3/20 |

FOREIGN PATENT DOCUMENTS

| | | |
|---|---|---|
| CN | 104036714 A | 9/2014 |
| CN | 104318886 A | 1/2015 |
| CN | 105223746 A | 1/2016 |
| CN | 107403610 A | 11/2017 |

\* cited by examiner

GATE DRIVER ON ARRAY (GOA) CIRCUIT UNIT, GOA CIRCUIT, AND DISPLAY PANEL

CROSS REFERENCE TO RELATED APPLICATIONS

This application is a continuing application of PCT Patent Application No. PCT/CN2018/076548, entitled "GATE DRIVER ON ARRAY (GOA) CIRCUIT UNIT, GOA CIRCUIT, AND DISPLAY PANEL", filed on Feb. 12, 2018, which claims priority to Chinese Patent Application No. 201711497552.8, filed on Dec. 29, 2017, both of which are hereby incorporated in its entireties by reference.

BACKGROUND

1. Technical Field

The present disclosure relates to a gate driver on array (GOA) circuit unit, a GOA circuit having the GOA circuit unit, and a display panel having the GOA circuit.

2. Description of Related Art

In the display field, the gate driver on array (GOA) circuit is usually adopted to drive the pixel circuit, instead of the external chips. The gate driver ICs are manufactured on the array substrate by the manufacturing method of the array substrate of the display. As such, the manufacturing process of the display devices may be simplified, the cost may be reduced, and the integration of the display devices may be improved.

The GOA circuit may include a plurality of GOA circuits connected in cascaded. Each of the GOA circuit units may drive at least one line of the pixels of the array substrate. The GOA circuit unit may provide two kinds of the signals as follow.

(1) Scan signals. The scan signals are configured to turn on the thin film transistor (TFT) of the pixels in the line within a time period. The scanning data signals may be inputted to and may be stored in the capacitor of the pixels in the line within the time period, and the TFT may not be turned off for the rest of the time. As such, the capacitor may not be affected by the subsequent scanning data signals. In addition, the scan signals are further configured to initialize the potential of the capacitor and to initialize the anode of the organic light-emitting diode (OLED) before the scanning data signals input to the capacitor.

(2) Emission signals (EM). The emission signals are configured to drive some of the TFTs when the scan signals turn on the TFTs of the pixels in the line. As such, the OLED may be prevented from emitting when reading the scanning data signals or during the initiation process, so as to guarantee the scanning data signals are correctly read.

The conventional GOA circuit unit may include two independent circuit portions. That is, the scan circuit portion and the emission circuit portion. The scan circuit portion is configured to provide the scan signals. The emission portion is configured to provide the emission signals. Each of the circuits may include individual TFTs and capacitors. Therefore, the integral GOA circuit unit and the cascaded GOA circuit may include much more TFTs and capacitors. However, the GOA circuits are usually arranged at the rim of the array substrate of the display devices, and the narrow frame design may not be achieved. In addition, the two independent circuit portions may cause the problem of output misalignment.

SUMMARY

In one aspect, the present disclosure relates to a gate driver on array (GOA) circuit unit, including: an emission portion and a scan portion: wherein the scan portion includes: a first thin film transistor (TFT), a fourth TFT, a fifth TFT, a sixth TFT a first capacitor, a turn-on signal end, a first clock signal end, a second clock signal end, a power supply end, and a first node; a gate of the first TFT connects to the first clock signal end, a source of the first TFT connects to the turn-on signal end, and a drain of the first TFT connects to the first node; a gate of the fourth TFT connects to an output end of the emission portion, a source of the fourth TFT connects to the power supply end, and a drain of the fourth TFT connects to the first node; a gate of the fifth TFT connects to the first node, a source of the fifth TFT connects to the second clock signal end, and a drain of the fifth TFT connects to an output end of the scan portion; a gate of the sixth TFT connects to the output end of the emission portion, a source of the sixth TFT connects to the power supply end, and a drain of the sixth TFT connects to the output end of the scan portion; and one end of the first capacitor connects to the first node, and the other end of the first capacitor connects to the drain of the fifth TFT.

The GOA circuit further includes: a second TFT, a third TFT, and a low level end; a gate of the second TFT connects to the low level end, a source of the second TFT connects to the drain of the first TFT, and a drain of the second TFT connects to the first node; the drain of the first TFT connects to the first node via the second TFT, a gate of the third TFT connects to the first clock signal end, and a drain of the third TFT connects to the first node; and the drain fourth TFT connects to the first node via the third TFT.

The first TFT, the second TFT, the third TFT, the fourth TFT, the fifth TFT, and the sixth TFT are P-type TFTs.

The power supply end is a high level end configured to output at a high potential.

The power supply end is a low level end configured to output at a low potential.

The emission portion includes: a seventh TFT, an eighth TFT, a ninth TFT, a tenth TFT, an eleventh TFT, a twelfth TFT, a thirteenth TFT, a fourteenth TFT, a fifteenth TFT, a sixteenth TFT a second capacitor, a third capacitor, a fourth capacitor, a third clock signal end, a first controlling clock signal end, a second node, a third node, a fourth node, and a fifth node; a source of the fourteenth TFT connects to an input end of the emission portion, a gate of the fourteenth TFT connects to the first controlling clock signal end, and a drain of the fourteenth TFT connects to the third node; a source of the fifteenth TFT connects to the third node, a gate of the fifteenth TFT connects to the third clock signal end, and a drain of the fifteenth TFT connects to a source of the sixteenth TFT; a gate of the sixteenth TFT connects to the second node, and a drain of the sixteenth TFT connects to a high level end; a gate of the thirteenth TFT connects to the first controlling clock signal end, a drain of the thirteenth TFT connects to a low level end, and a source of the thirteenth TFT connects to the second node; a gate of the twelfth TFT connects to the third node, a drain of the twelfth TFT connects to the second node, and a source of the twelfth TFT connects to the first controlling clock signal end; a gate of the eleventh TFT connects to the second node, a source of the eleventh TFT connects to the third clock signal end, and a drain of the eleventh TFT connects to the fifth node; one end of the fourth capacitor connects to the second node, and the other end of the fourth capacitor connects the fifth node; a source of the tenth TFT connects to the fifth node, a gate of the tenth TFT connects to the third clock signal end, and a drain of the tenth TFT connects to the fourth node; a source of the ninth TFT connects to the fourth node, a gate of the ninth TFT connects to the third node, and a drain of the ninth TFT connects to the high level end; a gate of the eighth TFT connects to the fourth node, a source of the eighth TFT connects to the high level end, and a drain of the eighth TFT connects to a source of the seventh TFT; a gate of the seventh TFT connects to the third node, and a drain of the seventh TFT connects to the low level end; one end of the third capacitor connects to the fourth node, and the other end of the third capacitor connects to the high level end; one end of the second capacitor connects to the third clock signal end, and the other end of the second capacitor connects to the third node; and the source of the seventh TFT is configured to be the output end of the emission portion.

In another aspect, the present disclosure further relates to a GOA circuit, including the GOA circuit unit described in above.

In another aspect, the present disclosure further relates to a display panel, including a plurality lines of the pixels, and a plurality of the GOA circuit unit described in above, wherein each of the lines of the pixels connects to one GOA circuit, and the line of the pixels is driven by the GOA circuit unit.

In view of the above, the fourth TFT and the sixth TFT of the GOA circuit may be controlled by the output end of the emission portion. The output end of the scan portion may be driven by the output end of the emission portion to generate the scan signals. As such, the use of the additional TFTs and capacitors to drive the output of the scan portion can be avoided, the number of the TFTs and the capacitors may be reduced, a narrow frame design may be achieved, and the output signals may be more stable and may not easily be misaligned.

DETAILED DESCRIPTION

Following embodiments of the invention will now be described in detail hereinafter with reference to the accompanying drawings. To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments In the following description, in order to avoid the known structure and/or function unnecessary detailed description of the concept of the invention result in confusion, well-known structures may be omitted and/or functions described in unnecessary detail.

Figure 1:
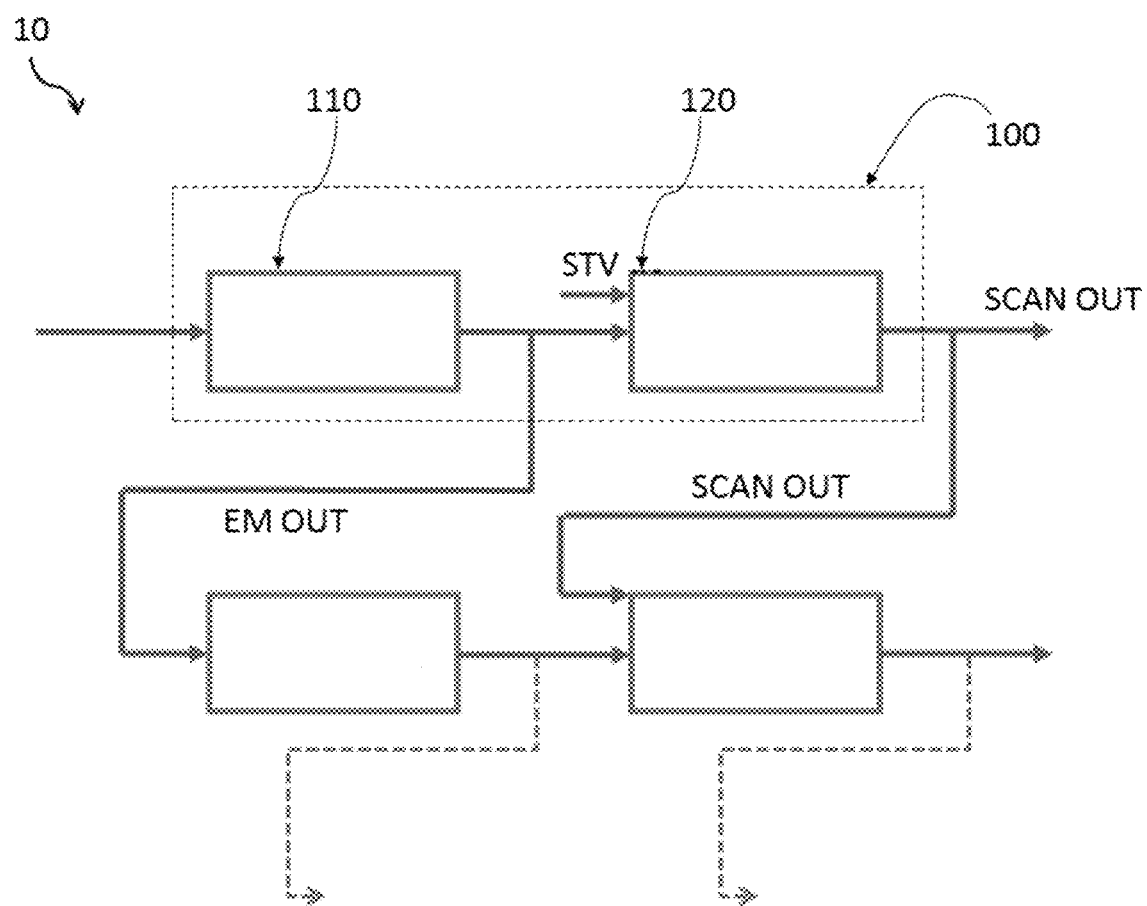
FIG. 1 is a circuit diagram illustrating a gate on driver (GOA) circuit in accordance with one embodiment of the present disclosure.
Figure 6:
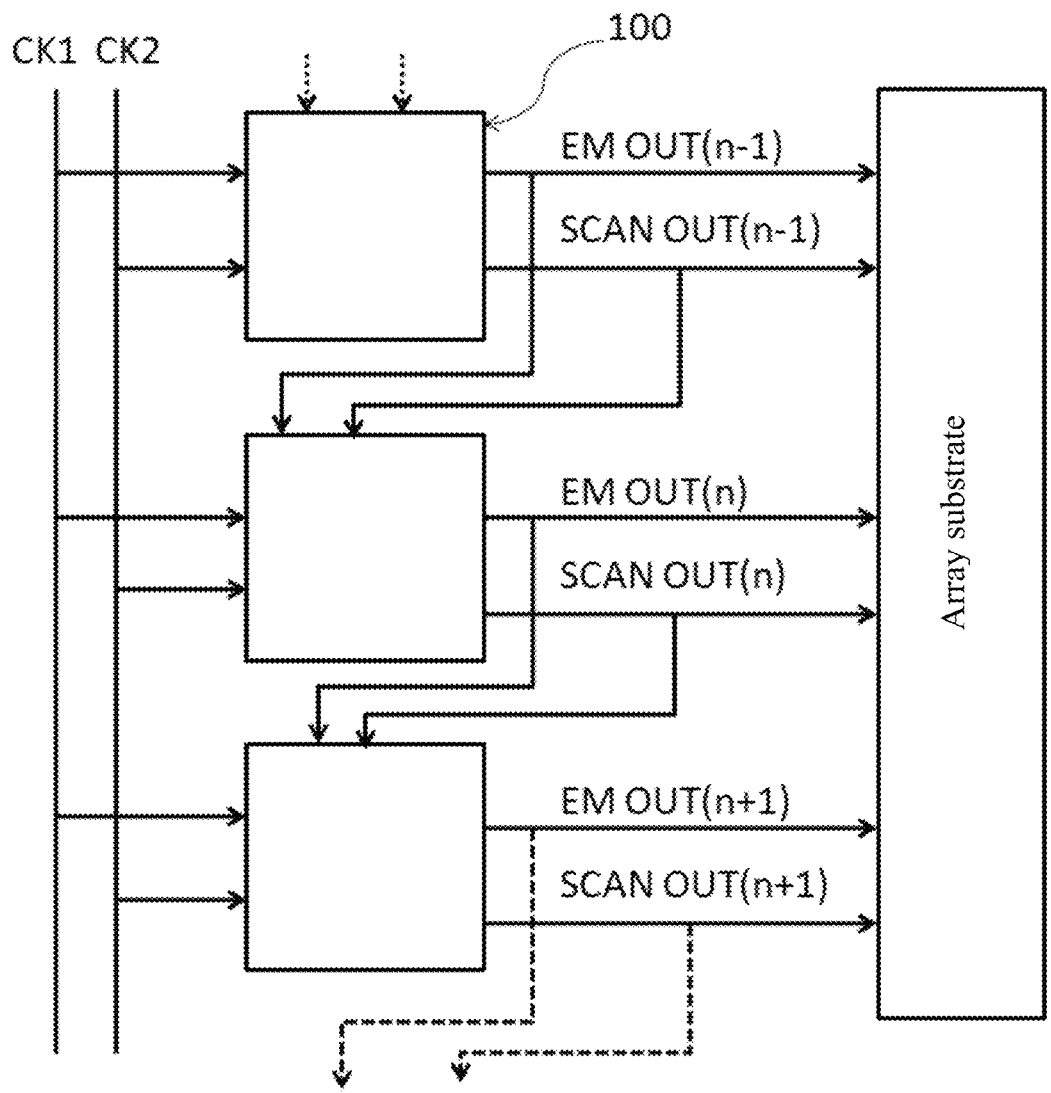
FIG. 6 is a circuit diagram illustrating a scenario of a GOA circuit in accordance with one embodiment of the present disclosure.

Referring to FIG. 1 and FIG. 6, a plurality of gate driver on array (GOA) circuit units 100 are connected in cascaded to form a GOA circuit 10. Each of the GOA circuit units 100 drives at least one line of pixels on display array substrate. Each of the GOA circuit unit 100 corresponds to at least one scanning line. A plurality of the pixels are arranged in lines and in rows on the array substrate of a display panel to form a pixel array. In one example, each of the GOA circuit units 100 connects to one scanning line and corresponds to one line of the pixels. An output end of each of the GOA circuit unit 100 connects to one line of the pixels. The output end of the GOA circuit unit 100 further connects to an input end of the next GOA circuit unit 100 to turn on the next GOA circuit unit 100. For example, an output end of a n-th GOA circuit unit 100 connects to one line of the pixels and further connects to the input end of the next [(n+1)-th] GOA circuit unit. An input end of the n-th GOA circuit unit 100 connects to an output end of the previous [(n−1)-th] GOA circuit unit, as shown in FIG. 4, wherein "n" is a natural number greater than or equal to 1.

Figure 2:
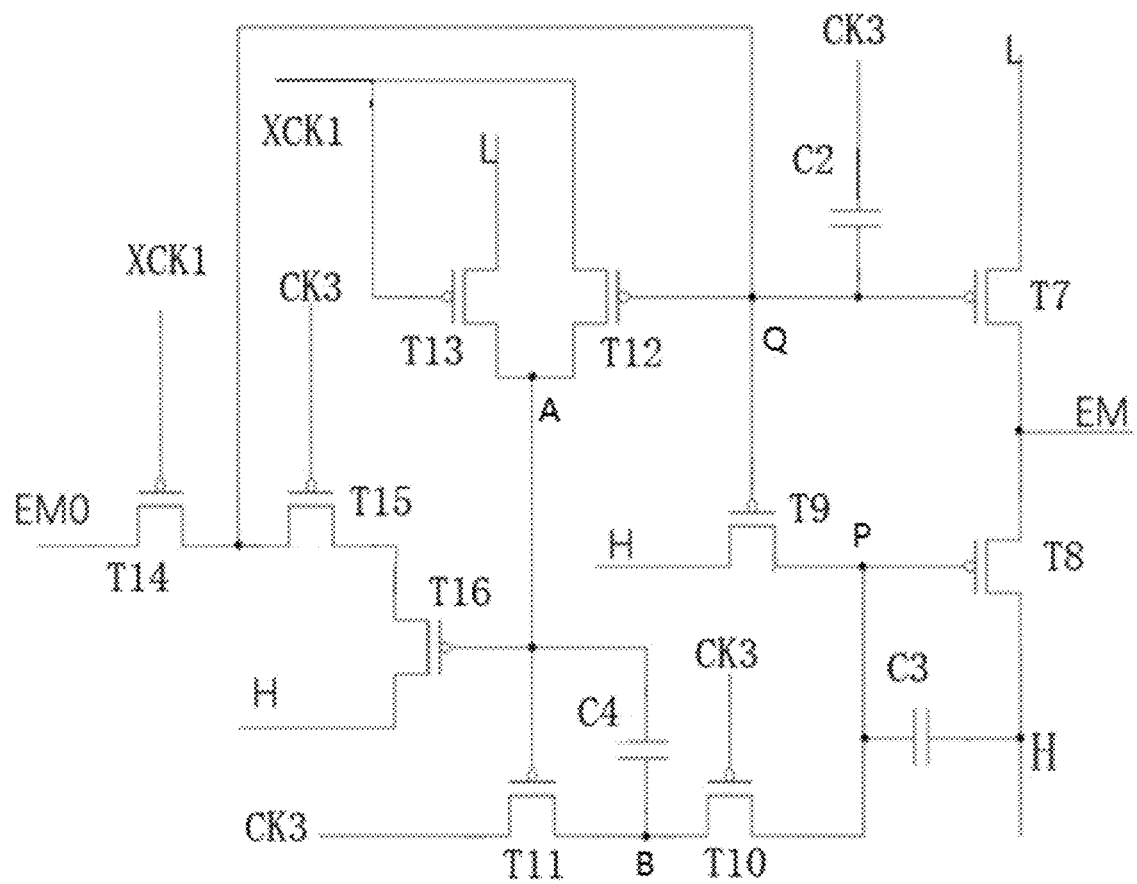
FIG. 2 is a circuit diagram illustrating an emission portion of the GOA circuit in FIG. 1.
Figure 4:
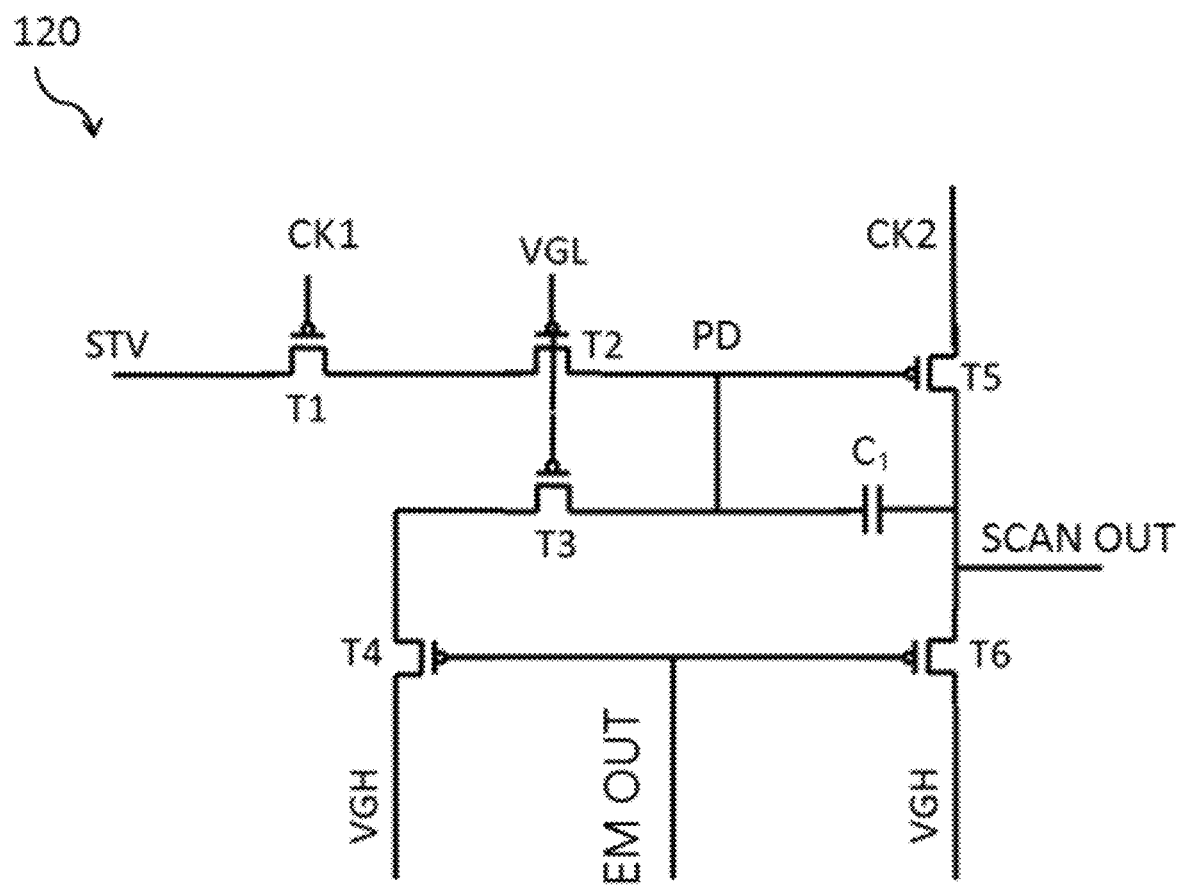
FIG. 4 is a circuit diagram illustrating a scan portion of the GOA circuit in FIG. 1.

Referring to FIG. 2 and FIG. 4, each of the GOA circuit unit 100 may include an emission portion 110 and a scan portion 120. FIG. 2 is a circuit diagram illustrating the emission portion 110. FIG. 4 is a circuit diagram illustrating the scan portion 120. The emission portion 110 is configured to generate emission signals. The scan portion 120 is configured to generate scan signals. In one example, the scan signals are generated by the emission signals of the emission portion 110. An output end of each of the emission portions 110 connects to an input end of the scan portion 120 within the same GOA circuit unit 100, and the output end of each of the emission portions 110 further connects to an input end of the emission portion 110 within the next GOA circuit unit 100. The input end of each of the emission portions 110 connects to an output end of the emission portion 110 within the previous GOA circuit unit 100. An output end of each of the scan portions 120 connects to one line of the pixels, and further connects to the input end of the scan portion 120 of the next GOA circuit unit 100. The input end of each of the scan portion 120 connects to the output end of the emission portion 110 within the same GOA circuit unit 100, as shown in FIG. 1.

As shown in FIG. 2, the emission portion 110 includes: a seventh TFT T7, an eighth TFT T8, a ninth TFT T9, a tenth TFT T10, an eleventh TFT T11, a twelfth TFT T12, a thirteenth TFT T13, a fourteenth TFT T14, a fifteenth TFT T15, a sixteenth TFT T16, a second capacitor C2, a third capacitor C3, a fourth capacitor C4, a third clock signal end CK3, a first controlling clock signal end XCK1, a second node "A", a third node "Q", a fourth node "P", and a fifth node "B".

A source of the fourteenth TFT T14 connects to the input end EM0 of the emission portion 110, a gate of the fourteenth TFT T14 connects to the first controlling clock signal end XCK1, and a drain of the fourteenth TFT T14 connects to the third node "Q". A source of the fifteenth TFT T15 connects to the third node "Q", a gate of the fifteenth TFT T15 connects to the third clock signal end CK3, and a drain of the fifteenth TFT T15 connects to a source of the sixteenth TFT T16. A gate of the sixteenth TFT T16 connects to the second node "A", and a drain of the sixteenth TFT T16 connects to a high level end. A gate of the thirteenth TFT T13 connects to the first controlling clock signal end XCK1, a drain of the thirteenth TFT T13 connects to a low level end, and a source of the thirteenth TFT T13 connects to the second node "A". A gate of the twelfth TFT T12 connects to the third node "Q", a drain of the twelfth TFT T12 connects to the second node "A", and a source of the twelfth TFT T12 connects to the first controlling clock signal end XCK1. A gate of the eleventh TFT T11 connects to the second node "A", a source of the eleventh TFT T11 connects to the third clock signal end CK3, and a drain of the eleventh TFT T11 connects to the fifth node "B". One end of the fourth capacitor C4 connects to the second node "A", and the other end of the fourth capacitor C4 connects the fifth node "B". A source of the tenth TFT T10 connects to the fifth node "B", a gate of the tenth TFT T10 connects to the third clock signal end CK3, and a drain of the tenth TFT T10 connects to the fourth node "P". A source of the ninth TFT T9 connects to the fourth node "P", a gate of the ninth TFT T9 connects to the third node "Q", and a drain of the ninth TFT T9 connects to the high level end. A gate of the eighth TFT T8 connects to the fourth node "P", a source of the eighth TFT T8 connects to the high level end, and a drain of the eighth TFT T8 connects to a source of the seventh TFT T7. A gate of the seventh TFT T7 connects to the third node "Q", and a drain of the seventh TFT T7 connects to the low level end. One end of the third capacitor C3 connects to the fourth node "P", and the other end of the third capacitor C3 connects to the high level end. One end of the second capacitor C2 connects to the third clock signal end CK3, and the other end of the second capacitor C2 connects to the third node "Q". The source of the seventh TFT T7 is configured to be the output end EM of the emission portion.

Figure 3:
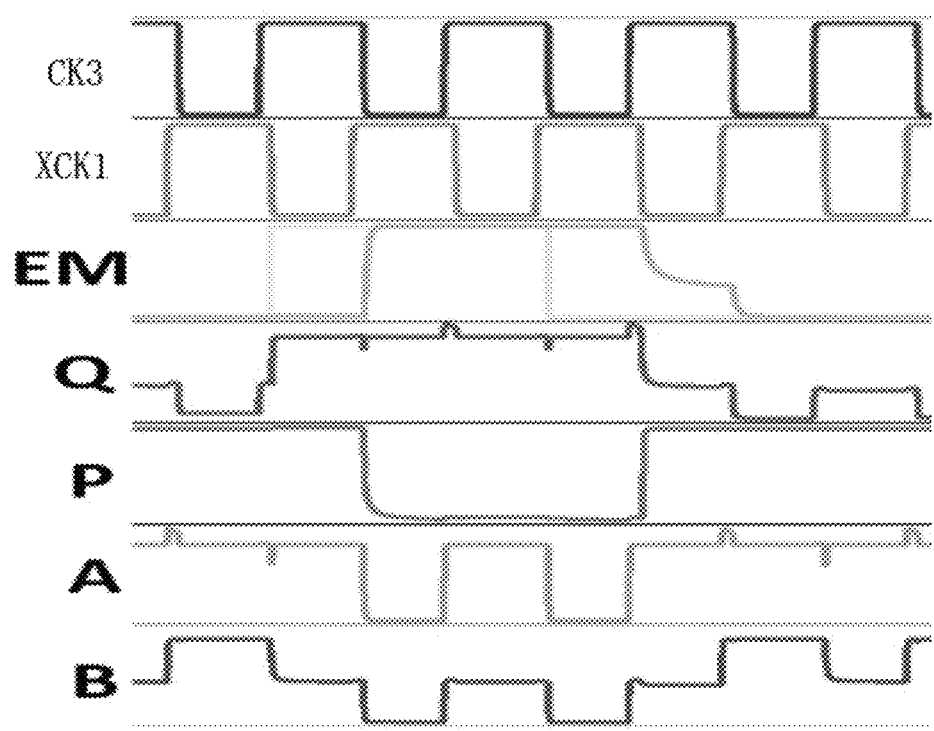
FIG. 3 is a timing diagram of the emission portion in FIG. 2.

Referring to FIG. 3, signals changes of the emission portion 110 is described as follow.

In a first phase, the third clock signal end CK3 is configured to be a high potential "H", the first controlling clock signals are configured to be at a low potential "L", and the input end EM0 of the emission portion 110 is configured to be at the high potential "H". As such, the fourteenth TFT T14 is turned on. The third node "Q" is configured to be at the high potential "H", and the thirteenth TFT T13 is turned on. A potential of the second node "A" is configured to be as (L+Vth), and the eleventh TFT T11 is turned on. The third node "Q" is configured to be at the high potential "H", and the seventh TFT T7 is turned off. The fourth node "P" is maintained to be at a potential of the previous level, and the output end EM of the emission portion is maintained to be at the low potential "L" of a last phase.

In a second phase, the third clock signal end CK 3 is configured to be at the low potential "L", and the first controlling clock signal end XCK1 is configured to be at the high potential "H". When the third clock signal end CK3 is transited from the high potential "H" to the low potential "L", the fifth node "B" may be transited from the high potential "H" to the low potential "L". The potential of the second node "A" may further be pulled-down by a couple effect of the fourth capacitor C4. The fourth node "P" is configured to be at the low potential (L+Vth). The eighth TFT T8, the fifteenth TFT T15, and the sixteenth TFT T16 may be turned on. The third node "Q" is configured to be at the high potential "H". The seventh TFT T7 may be turned off. The output end EM of the emission portion may output at the high potential "H".

In a third phase, the third clock signal end CK3 is configured to be at the high potential "H", the first controlling clock signal end XCK1 is configured to be at the low potential "L", and the input end EM0 of the emission portion is configured to be at the high potential "H". The first controlling clock signal end XCK1 is configured to be at the low potential "L". The thirteenth TFT T13 may be turned on. The potential of the second node "A" is configured to be at the low potential (L+Vth). The third node "Q" is configured to be at the high potential "H". The seventh TFT T7 may be turned off. The fourth node "P" is maintained to be at the potential of the previous phase. The eighth TFT T8 may be turned on. The output end EM of the emission portion may output at the high potential "H".

In a fourth phase, the third clock signal end CK 3 is configured to be at the low potential "L", the first controlling clock signal end XCK1 is configured to be at the high potential "H", and the input end EM0 of the emission portion is configured to be at the low potential "L". When the third clock signal end CK3 is transited from the high potential "H" to the low potential "L", the fifth node "B" is transited from the high potential "H" to the low potential "L". The potential of the second node "A" may further be pulled-down. The fifteenth TFT T15 and the sixteenth TFT T16 may be turned on. The third node "Q" is configured to be at the high potential "H". The seventh TFT T7 may be turned off. When the third clock signal end CK3 is configured to be at low potential "L". The tenth TFT T10 and the eleventh TFT T11 may be turned on. The potential of the fourth node "P" is configured to be at the low potential (L+Vth). The eighth TFT T8 may be turned on. The output end EM of the emission portion may output at the high potential "H".

In a fifth phase, the third clock signal end CK3 is configured to be at the high potential "H", the first controlling clock signal end XCK1 is configured to be at the low potential "L", and the input end EM0 of the emission portion is configured to be at the low potential "L". The fourteenth TFT T14 may be turned on. The third node "Q" is configured to be at the low potential (L+Vth). The ninth TFT T9 may be turned on. The fourth node "P" is configured to be at the high potential "H". The seventh TFT T7 and the eighth TFT T8 may be turned on. The output end EM of the emission portion may output at the low potential (L+Vth).

In a sixth phase, the third clock signal end CK3 is configured to be at the low potential "L", the first controlling clock signal end XCK1 is configured to be at the high potential "H", and the input end EM0 of the emission portion is configured to be at the low potential "L". When the third clock signal end CK3 is transited form the high potential "H" to the low potential "L", the second capacitor C2 may further be pulled-down due to the couple effect of the second capacitor C2. As such, the potential of the third node "Q" may further be pulled-down, the seventh TFT T7 may be turned on, and the output end EM of the emission portion may output at the low potential "L".

As shown in FIG. 4, the scan portion 120 includes a first TFT T1, a second TFT T2, a third TFT T3, a fourth TFT T4, a fifth TFT T5, a sixth TFT T6, a first capacitor C1, a turn-on signal end STV, a first clock signal end CK1, a second clock signal end CK2, a power supply end, a low level end VGL, and a first node PD. Gates of the fourth TFT T4 and the sixth TFT T6 connect to the output end EM of the emission portion. The output end EM of the emission portion is configured to control the fourth TFT T4 and the sixth TFT T6 to turn on or turn off. The emission portion and the scan portion may cooperatively form the GOA circuit unit. The power supply end may output at the high potential and may output at the low potential. When the power supply end is configured to be the high level end VGH, the power supply end may be maintained to output at the high potential. When the power supply end is configured to be the low level end VGL, the power supply end may be maintained to output at the low potential. In one example, the power supply end is the high level end VGH, and the high level end VGH is used as an example in the following description.

A gate of the first TFT T1 connects to the first clock signal end CK1, and a source of the first TFT T1 connects to the turn-on signal end STV. A gate of the second TFT T2 connects to the low level end VGL, a source of the second TFT T2 connects to a drain of the first TFT, and a drain of the second TFT T2 connects to the first node PD. A gate of the third TFT T3 connects to the first clock signal end CK1, and a drain of the third TFT T3 connects to the first node PD. The gate of the fourth TFT T4 connects to the output end EM OUT of the emission portion 110, a source of the fourth TFT T4 connects to the high level end VGH, and a drain of the fourth TFT T4 connects to a source of the third TFT T3. A gate of the fifth TFT T5 connects to the first node PD, a source of the fifth TFT T5 connects to the second clock signal end CK2, and a drain of the fifth TFT T5 connects to the output end SCAN OUT of the scan portion 120. The gate of the sixth TFT T6 connects to the output end EM OUT of the emission portion 110, a source of the sixth TFT T6 connects to the high level end VGH, and a drain of the sixth TFT T6 connects to the output end SCAN OUT of the scan portion 120. One end of the first capacitor C1 connects to the first node PD, and the other end of the first capacitor C1 connects to the drain of the fifth TFT T5. In one example, the first TFT T1, the second TFT T2, the third TFT T3, the fourth TFT T4, the fifth TFT T5, and the sixth TFT T6 are positive channel metal oxide semiconductor (PMOS) transistors. That is, the first TFT T1, the second TFT T2, the third TFT T3, the fourth TFT T4, the fifth TFT T5, and the sixth TFT T6 are P-type TFTs. That is, the TFTs are active when reset signals are at the low potential.

Figure 5:
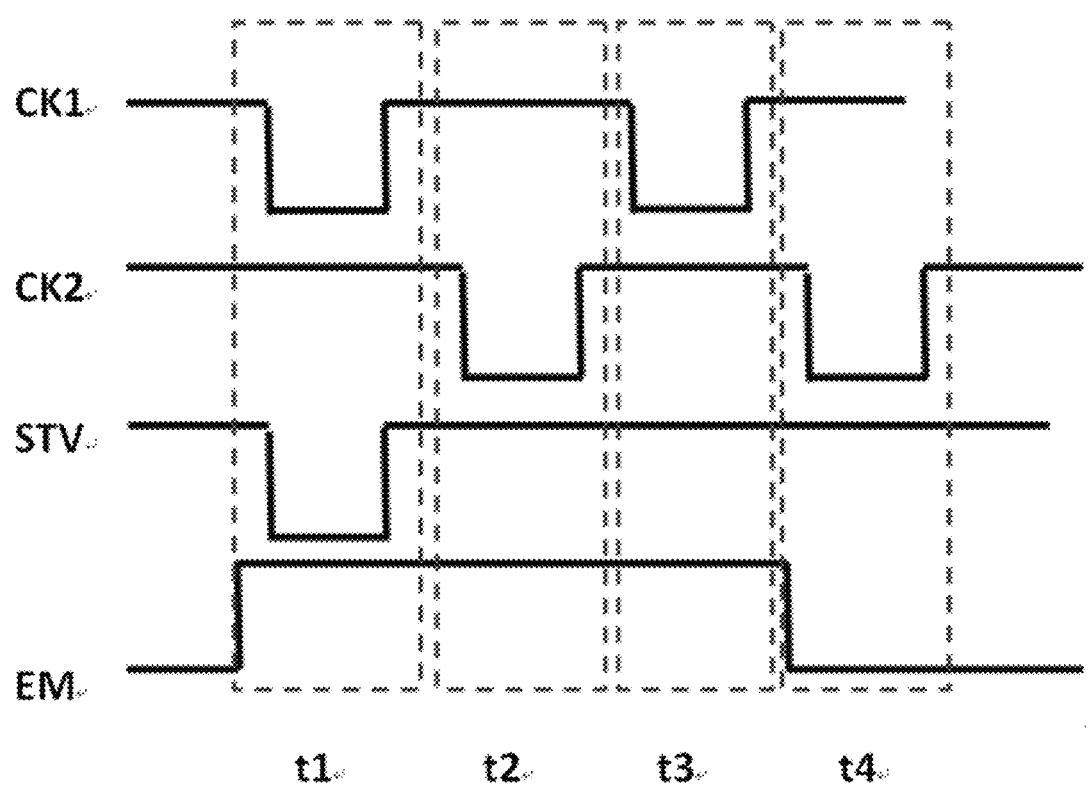
FIG. 5 is a timing diagram of the scan portion in FIG. 4.

Referring to FIG. 5, turn-on signals may be inputted to a first GOA circuit unit 100 of the GOA circuit 10 from the turn-on signal end STV to turn on the first GOA circuit unit 100. First clock signals may be inputted to the first clock signal end CK1, second clock signals may be transmitted to the second clock signal end CK2, and output signals may be transmitted to the output end EM OUT of the emission portion 110. As such, the GOA circuit 10 may be operated. The operation principle is described as follow.

In a first time period t1, the turn-on signal end STV is configured to be at the low potential, the first clock signal end CK1 is configured to be at the low potential, the second clock signal end CK2 is configured to be at the high potential, and the output end EM OUT of the emission portion 110 is configured to be at the high potential.

The first clock signal end CK1 is configured to be at the low potential, and the first TFT T1 may be turned on. The second TFT T2 also connects to the low level end VGL, and the second TFT T2 may be turned on. Low level signals of the turn-on signal end STV pass through the first TFT T1, the second TFT T2 and enter the first node PD. As such, the first node PD, the turn-on signal end STV may be at the low potential, and the first capacitor C1 is charged. A voltage of the first node PD is configured to be as $(V_{pd}=V_0)$, wherein $V_0$ is an input voltage of the turn-on signal end STV. The output end EM OUT of the emission portion 110 is configured to be at the high potential, and the fourth TFT T4 and the sixth TFT T6 may be turned off. The gate of the third TFT T3 connects to the low level end VGL, and the third TFT T3 may be at a turn-on state. The first node PD is configured to be at the low potential, and the fifth TFT T5 may be turned on. The second clock signal end CK2 connected by the source of the fifth TFT T5 is configured to be at the high potential, as such the output end EM OUT of the scan portion 120 may be at the high potential.

In a second time period t2, the turn-on signal end STV is configured to be at the high potential, the first clock signal end CK1 is configured to be at the high potential, the second clock signal end CK2 is configured to be at the low potential, and the output end EM OUT of the emission portion 110 is configured to be at the high potential.

The first clock signal end CK1 is configured to be at the high potential, and the first TFT T1 may be turned off. The first node PD is maintained to be at the low potential due to the first capacitor C1, and the voltage of the first node PD is maintained to be as $(V_{pd}=V_0)$. The output end EM OUT of the emission portion 110 is configured to be at the high potential, and the fourth TFT T4 and the sixth TFT T6 may be at a turn-off state. The first node PD is configured to be at the low potential, and the fifth TFT T5 may be turned on. The second clock signal end CK2 connected by the source of the fifth TFT T5 is configured to be at the low potential, and the output end SCAN OUT of the scan portion 120 is configured to be at the low potential. The fifth TFT T5 may have a threshold voltage Vth, and a voltage outputted from the output end SCAN OUT of the scan portion 120 is configured to be as $(V_0+V_{th})$. The second TFT T2 and the third TFT T3 connect to the low signal end VGL, and are maintained to be at the turn-on state.

In a third time period t3, the turn-on signal end STV is configured to be at the high potential, the first clock signal end CK1 is configured to be at the low potential, the second clock signal end CK2 is configured to be at the high potential, and the output end EM OUT of the emission portion 110 is configured to be at the high potential.

The first clock signal end CK1 is configured to be at the low potential, and the first TFT T1 may be turned on. The second TFT T2 also connects to the low level end VGL, and the second TFT T2 may be turned on. The low level signals of the turn-on signal end STV pass through the first TFT T1, the second TFT T2 and enter the first node PD. The potential of the first node PD is configured to be at the low potential, which is the same with the last time period, due to the first capacitor C1. The output end EM OUT of the emission portion EM is configured to be at the high potential, and the fourth TFT T4 and the sixth TFT T6 may be at the turn-off state. The gate of the third TFT T3 connects to the low level end VGL, and the third TFT T3 may be at the turn-on state. The first node PD is configured to be at the low potential, and the fifth TFT T5 is turned on. The second clock signal end CK2 connected by the source of the fifth TFT T5 is configured to be at the high potential, and the output end EM OUT of the scan portion 120 may be at the high potential.

In a fourth time period t4, the turn-on signal end STV is configured to be at the high potential, the first clock signal end CK1 is configured to be at the high potential, the second clock signal end CK2 is configured to be at the low potential, and the output end EM OUT of the emission portion 110 is configured to be at the low potential.

The first clock signal end CK1 is configured to be at the high potential, and the first TFT T1 may be turned off. The output end EM OUT of the emission portion 110 is configured to be at the low potential, and the fourth TFT T4 and the sixth TFT T6 are turned on. The second TFT T2 and the third TFT T3 connect the low level end VGL, and the second TFT T2 and the third TFT T3 may be maintained to be at the turn-on state. The high level end VGH connected by the fourth TFT T4 is configured to pull-up the potential of the first node PD to the high potential. As such, the fifth TFT T5 may be turned off. The high level end VGH connected by the sixth TFT T6 is configured to maintain the output end SCAN OUT of the scan portion 120 to be at the high potential.

The output end EM OUT of the emission portion 110 of the GOA circuit 10 may drive the output end SCAN OUT of the scan portion 120 of the GOA circuit 10 to generate the scan signals within the fourth time period t4. As such, the use of the additional TFTs and capacitors to drive the output of the scan portion can be avoided, the number of the TFTs and the capacitors may be reduced, a narrow frame design may be achieved, and the output signals may be more stable and may not easily be misaligned. Moreover, during the operation of the GOA circuit 10, the second TFT T2 and the third TFT T3 are maintained to connect to the low level end VGL, and maintained to be at the turn-on state. Such that the fourth TFT T4 connected by the first TFT T1 and the high level end VGH may be prevented from generating a leakage current, which may cause the potential of the first node PD being unstable, when the potential of the first node PD is pulled to $2V_0$ and the turn-on signal end STV is configured to be at the high level. In other words, the second TFT T2 and third TFT T3 may reduce the leakage current and may stabilize the potential of the first node PD.

Figure 7:
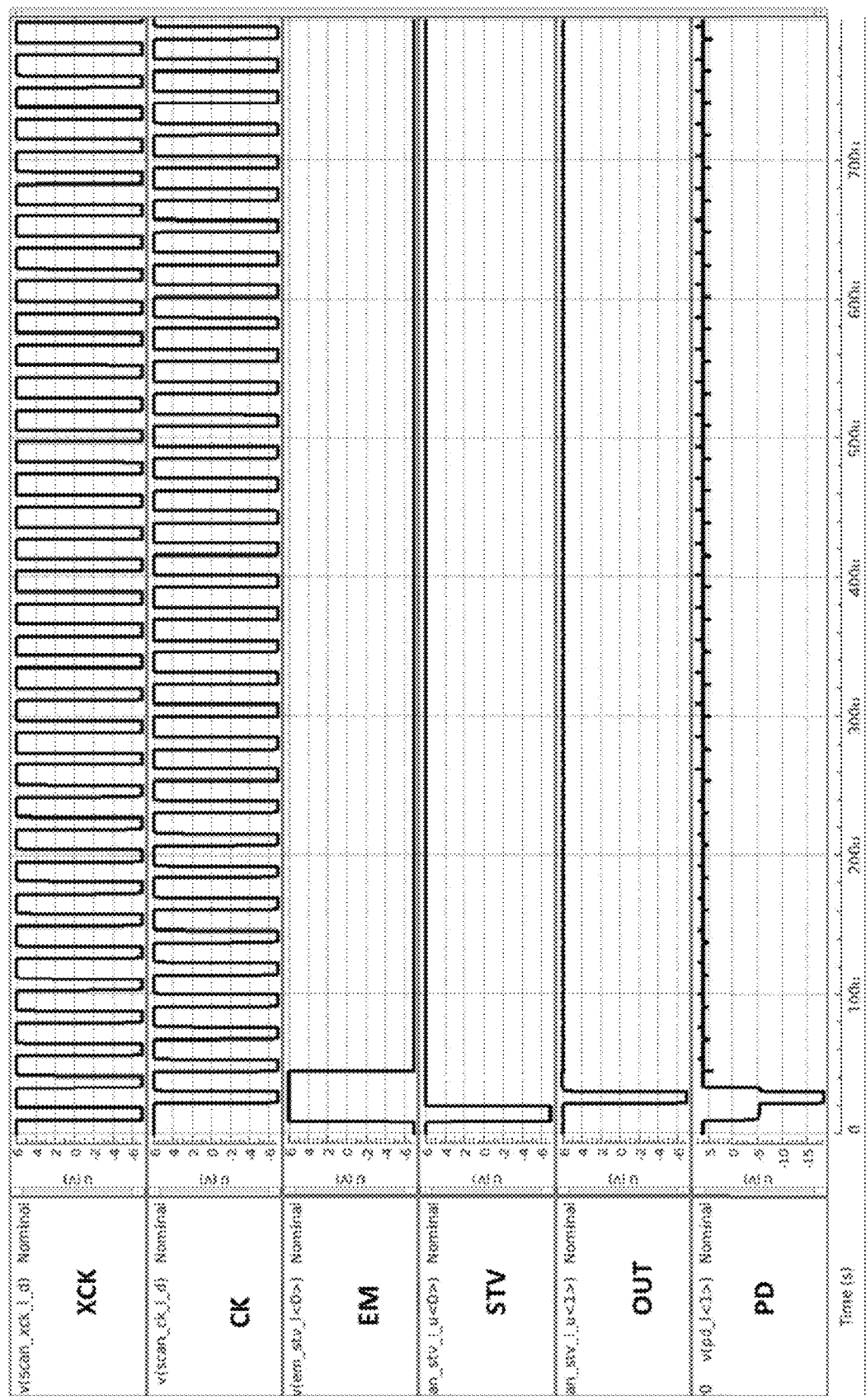
FIGS. 7 and 8 are diagrams illustrating an operational process of the scan portion in accordance with one embodiment of the present disclosure and potentials of each node in simulation of level 1 and level 20.
Figure 8:
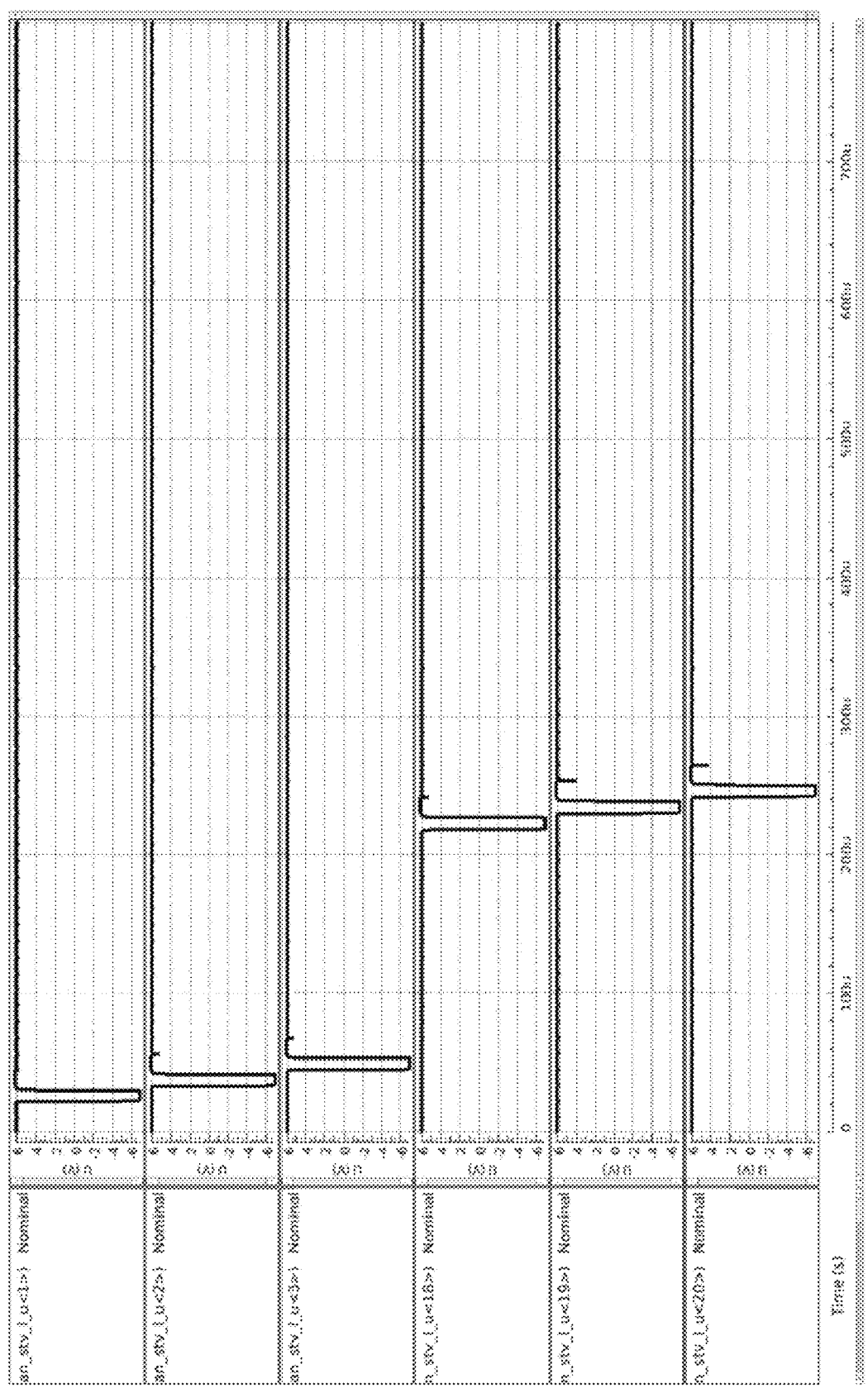

The potentials of each of the nodes, during the operation of the SCAN portion 120, in the simulations of level 1 and level 20 are shown in FIG. 7 and FIG. 8. According to FIG. 7 and FIG. 8, it can be seen that the output end SCAN OUT of the scan portion 120 output the signals properly, and the potential of the first node PD is more stable.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A gate driver on array (GOA) circuit unit, comprising:
   an emission portion and a scan portion;
   wherein the scan portion comprises:
   a first thin film transistor (TFT), a fourth TFT, a fifth TFT, a sixth TFT, a first capacitor, a turn-on signal end, a first clock signal end, a second clock signal end, a power supply end, and a first node;
   a gate of the first TFT connects to the first clock signal end, a source of the first TFT connects to the turn-on signal end, and a drain of the first TFT connects to the first node;
   a gate of the fourth TFT connects to an output end of the emission portion, a source of the fourth TFT connects to the power supply end, and a drain of the fourth TFT connects to the first node;
   a gate of the fifth TFT connects to the first node, a source of the fifth TFT connects to the second clock signal end, and a drain of the fifth TFT connects to an output end of the scan portion;
   a gate of the sixth TFT connects to the output end of the emission portion, a source of the sixth TFT connects to the power supply end, and a drain of the sixth TFT connects to the output end of the scan portion; and
   one end of the first capacitor connects to the first node, and the other end of the first capacitor connects to the drain of the fifth TFT;
   wherein the GOA circuit further comprises:
   a second TFT, a third TFT, and a low level end;
   a gate of the second TFT connects to the low level end, a source of the second TFT connects to the drain of the first TFT, and a drain of the second TFT connects to the first node;
   the drain of the first TFT connects to the first node via the second TFT;
   a gate of the third TFT connects to the low level end, and a drain of the third TFT connects to the first node; and
   the drain fourth TFT connects to the first node via the third TFT.

2. The GOA circuit unit according to claim 1, wherein the first TFT, the second TFT, the third TFT, the fourth TFT, the fifth TFT, and the sixth TFT are P-type TFTs.

3. The GOA circuit unit according to claim 1, wherein the power supply end is a high level end configured to output at a high potential.

4. The GOA circuit unit according to claim 1, wherein the power supply end is a low level end configured to output at a low potential.

5. The GOA circuit unit according to claim 1, wherein the emission portion comprises:
   a seventh TFT, an eighth TFT, a ninth TFT, a tenth TFT, an eleventh TFT, a twelfth TFT, a thirteenth TFT, a fourteenth TFT, a fifteenth TFT, a sixteenth TFT, a second capacitor, a third capacitor, a fourth capacitor, a third clock signal end, a first controlling clock signal end, a second node, a third node, a fourth node, and a fifth node;
   a source of the fourteenth TFT connects to an input end of the emission portion, a gate of the fourteenth TFT connects to the first controlling clock signal end, and a drain of the fourteenth TFT connects to the third node;
   a source of the fifteenth TFT connects to the third node, a gate of the fifteenth TFT connects to the third clock signal end, and a drain of the fifteenth TFT connects to a source of the sixteenth TFT;
   a gate of the sixteenth TFT connects to the second node, and a drain of the sixteenth TFT connects to a high level end;
   a gate of the thirteenth TFT connects to the first controlling clock signal end, a drain of the thirteenth TFT connects to a low level end, and a source of the thirteenth TFT connects to the second node;
   a gate of the twelfth TFT connects to the third node, a drain of the twelfth TFT connects to the second node, and a source of the twelfth TFT connects to the first controlling clock signal end;

a gate of the eleventh TFT connects to the second node, a source of the eleventh TFT connects to the third clock signal end, and a drain of the eleventh TFT connects to the fifth node;

one end of the fourth capacitor connects to the second node, and the other end of the fourth capacitor connects the fifth node;

a source of the tenth TFT connects to the fifth node, a gate of the tenth TFT connects to the third clock signal end, and a drain of the tenth TFT connects to the fourth node;

a source of the ninth TFT connects to the fourth node, a gate of the ninth TFT connects to the third node, and a drain of the ninth TFT connects to the high level end;

a gate of the eighth TFT connects to the fourth node, a source of the eighth TFT connects to the high level end, and a drain of the eighth TFT connects to a source of the seventh TFT;

a gate of the seventh TFT connects to the third node, and a drain of the seventh TFT connects to the low level end;

one end of the third capacitor connects to the fourth node, and the other end of the third capacitor connects to the high level end;

one end of the second capacitor connects to the third clock signal end, and the other end of the second capacitor connects to the third node; and the source of the seventh TFT is configured to be the output end of the emission portion.

6. A GOA circuit, comprising the GOA circuit unit as claimed in claim 1.

7. The GOA circuit according to claim 6, wherein the first TFT, the second TFT, the third TFT, the fourth TFT, the fifth TFT, and the sixth TFT are P-type TFTs.

8. The GOA circuit according to claim 6, wherein the power supply end is a high level end configured to output at a high potential.

9. The GOA circuit according to claim 5, wherein the power supply end is a low level end configured to output at a low potential.

10. The GOA circuit according to claim 6, wherein the emission portion comprises:

a seventh TFT, an eighth TFT, a ninth TFT, a tenth TFT, an eleventh TFT, a twelfth TFT, a thirteenth TFT, a fourteenth TFT, a fifteenth TFT, a sixteenth TFT, a second capacitor, a third capacitor, a fourth capacitor, a third clock signal end, a first controlling clock signal end, a second node, a third node, a fourth node, and a fifth node;

a source of the fourteenth TFT connects to an input end of the emission portion, a gate of the fourteenth TFT connects to the first controlling clock signal end, and a drain of the fourteenth TFT connects to the third node;

a source of the fifteenth TFT connects to the third node, a gate of the fifteenth TFT connects to the third clock signal end, and a drain of the fifteenth TFT connects to a source of the sixteenth TFT;

a gate of the sixteenth TFT connects to the second node, and a drain of the sixteenth TFT connects to a high level end;

a gate of the thirteenth TFT connects to the first controlling clock signal end, a drain of the thirteenth TFT connects to a low level end, and a source of the thirteenth TFT connects to the second node;

a gate of the twelfth TFT connects to the third node, a drain of the twelfth TFT connects to the second node, and a source of the twelfth TFT connects to the first controlling clock signal end;

a gate of the eleventh TFT connects to the second node, a source of the eleventh TFT connects to the third clock signal end, and a drain of the eleventh TFT connects to the fifth node;

one end of the fourth capacitor connects to the second node, and the other end of the fourth capacitor connects the fifth node;

a source of the tenth TFT connects to the fifth node, a gate of the tenth TFT connects to the third clock signal end, and a drain of the tenth TFT connects to the fourth node;

a source of the ninth TFT connects to the fourth node, a gate of the ninth TFT connects to the third node, and a drain of the ninth TFT connects to the high level end;

a gate of the eighth TFT connects to the fourth node, a source of the eighth TFT connects to the high level end, and a drain of the eighth TFT connects to a source of the seventh TFT;

a gate of the seventh TFT connects to the third node, and a drain of the seventh TFT connects to the low level end;

one end of the third capacitor connects to the fourth node, and the other end of the third capacitor connects to the high level end;

one end of the second capacitor connects to the third clock signal end, and the other end of the second capacitor connects to the third node; and the source of the seventh TFT is configured to be the output end of the emission portion.

11. A display panel, comprising: a plurality of lines of pixels and a plurality of the GOA circuit unit as claimed in claim 1, wherein each lines of the pixels connect to one GOA circuit unit, and one line of the pixels is driven by the GOA circuit unit.

12. The display panel according to claim 11, wherein the first TFT, the second TFT, the third TFT, the fourth TFT, the fifth TFT, and the sixth TFT are P-type TFTs.

13. The display panel according to claim 11, wherein the power supply end is a high level end configured to output at a high potential.

14. The display panel according to claim 11, wherein the power supply end is a low level end configured to output at a low potential.

15. The display panel according to claim 11, wherein the emission portion comprises:

a seventh TFT, an eighth TFT, a ninth TFT, a tenth TFT, an eleventh TFT, a twelfth TFT, a thirteenth TFT, a fourteenth TFT, a fifteenth TFT, a sixteenth TFT, a second capacitor, a third capacitor, a fourth capacitor, a third clock signal end, a first controlling clock signal end, a second node, a third node, a fourth node, and a fifth node;

a source of the fourteenth TFT connects to an input end of the emission portion, a gate of the fourteenth TFT connects to the first controlling clock signal end, and a drain of the fourteenth TFT connects to the third node;

a source of the fifteenth TFT connects to the third node, a gate of the fifteenth TFT connects to the third clock signal end, and a drain of the fifteenth TFT connects to a source of the sixteenth TFT;

a gate of the sixteenth TFT connects to the second node, and a drain of the sixteenth TFT connects to a high level end;

a gate of the thirteenth TFT connects to the first controlling clock signal end, a drain of the thirteenth TFT connects to a low level end, and a source of the thirteenth TFT connects to the second node;

a gate of the twelfth TFT connects to the third node, a drain of the twelfth TFT connects to the second node, and a source of the twelfth TFT connects to the first controlling clock signal end;

a gate of the eleventh TFT connects to the second node, a source of the eleventh TFT connects to the third clock signal end, and a drain of the eleventh TFT connects to the fifth node;

one end of the fourth capacitor connects to the second node, and the other end of the fourth capacitor connects the fifth node;

a source of the tenth TFT connects to the fifth node, a gate of the tenth TFT connects to the third clock signal end, and a drain of the tenth TFT connects to the fourth node;

a source of the ninth TFT connects to the fourth node, a gate of the ninth TFT connects to the third node, and a drain of the ninth TFT connects to the high level end;

a gate of the eighth TFT connects to the fourth node, a source of the eighth TFT connects to the high level end, and a drain of the eighth TFT connects to a source of the seventh TFT;

a gate of the seventh TFT connects to the third node, and a drain of the seventh TFT connects to the low level end;

one end of the third capacitor connects to the fourth node, and the other end of the third capacitor connects to the high level end;

one end of the second capacitor connects to the third clock signal end, and the other end of the second capacitor connects to the third node; and the source of the seventh TFT is configured to be the output end of the emission portion.

* * * * *